(12) United States Patent
Bhavnagarwala et al.

(10) Patent No.: US 10,381,076 B2
(45) Date of Patent: Aug. 13, 2019

(54) CIRCUIT AND METHOD FOR CONFIGURABLE IMPEDANCE ARRAY

(71) Applicant: ARM Ltd., Cambridge (GB)

(72) Inventors: Azeez Jennudin Bhavnagarwala, Newtown, CT (US); Vikas Chandra, Fremont, CA (US); Brian Tracy Cline, Austin, TX (US)

(73) Assignee: ARM Ltd., Cambridge (GB)

(*) Notice: Subject to any disclaimer, the term of this patent is extended or adjusted under 35 U.S.C. 154(b) by 0 days.

(21) Appl. No.: 15/865,116

(22) Filed: Jan. 8, 2018

(65) Prior Publication Data

US 2018/0218772 A1    Aug. 2, 2018

Related U.S. Application Data

(63) Continuation of application No. 15/453,721, filed on Mar. 8, 2017, now Pat. No. 9,905,295, which is a continuation of application No. 14/979,156, filed on Dec. 22, 2015, now Pat. No. 9,773,550.

(51) Int. Cl.
| | |
|---|---|
| *H03M 1/00* | (2006.01) |
| *G11C 13/00* | (2006.01) |
| *G11C 11/38* | (2006.01) |
| *G11C 17/12* | (2006.01) |
| *H03M 1/78* | (2006.01) |
| *H03M 1/80* | (2006.01) |

(52) U.S. Cl.
CPC ...... *G11C 13/0069* (2013.01); *G11C 13/0002* (2013.01); *G11C 13/003* (2013.01); *G11C 13/004* (2013.01); *G11C 11/38* (2013.01); *G11C 13/0004* (2013.01); *G11C 17/12* (2013.01); *G11C 2213/75* (2013.01); *H03M 1/00* (2013.01); *H03M 1/78* (2013.01); *H03M 1/808* (2013.01)

(58) Field of Classification Search
CPC .. H03M 1/00; G11C 13/0004; G11C 13/0069; G11C 11/38; G11C 17/12
USPC ................. 341/133; 365/148, 163, 100, 104
See application file for complete search history.

(56) References Cited

U.S. PATENT DOCUMENTS

2008/0106925 A1* 5/2008 Paz de Araujo ........ H01L 45/04
365/148
2010/0226163 A1    9/2010 Savransky

FOREIGN PATENT DOCUMENTS

WO    2015163928 A1    10/2015

OTHER PUBLICATIONS

Notification Concerning Transmittal of International Preliminary Report on Patentability (Chapter 1 of the Patent Cooperation Treaty), dated Jul. 5, 2018, International Application No. PCT/GB2016/053931, 1 pg.

(Continued)

*Primary Examiner* — Joseph J Lauture
(74) *Attorney, Agent, or Firm* — Berkeley Law & Technology Group, LLP

(57) ABSTRACT

A configurable impeder is provided. The configurable impeder comprises of multiple CESs. Each of the CESs is capable of being configured into one of a plurality of impedance states. Further, a programing circuit is provided. The programing circuit provides a plurality of programing signals in dependence of an input signal. Each programing signal configures an impedance state of a respective CES from the plurality of CESs.

15 Claims, 10 Drawing Sheets

(56) References Cited

OTHER PUBLICATIONS

International Preliminary Report on Patentability (Chapter 1 of the Patent Cooperation Treaty), dated Jul. 5, 2018, International Application No. PCT/GB2016/053931, 1 pg.
Written Opinion of the International Searching Authority, dated Jul. 5, 2018, International Application No. PCT/GB2016/053931, 8 pgs.
Jahromi, "Memristor based Digital-to-Analog Convertor and its Programming", 23rd Iranian Conference on Electricalm Engineering, Jul. 2, 2015, pp. 1352-1356, 5 pgs.
McWilliams, et. al., "Device Characterization of Correlated Electron Random Access Memories", Journal of Applied Physics, American Institute of Physics, US, vol. 109, No. 9, May 13, 2011, pp. 91608-1-91608-6, 6 pgs.

* cited by examiner

CIRCUIT AND METHOD FOR CONFIGURABLE IMPEDANCE ARRAY

This application is a continuation of U.S. patent application Ser. No. 15/453,721, titled CIRCUIT AND METHOD FOR CONFIGURABLE IMPEDANCE ARRAY, filed Mar. 8, 2917 and issuing as U.S. Pat. No. 9,905,295, which is a continuation of U.S. patent application Ser. No. 14/979,156, titled CIRCUIT AND METHOD FOR CONFIGURABLE IMPEDANCE ARRAY, filed Dec. 22, 2015 and issuing as U.S. Pat. No. 9,773,550.

FIELD OF THE INVENTION

The present techniques generally relate to a configurable impeder, and in particular, to a configurable impeder comprised of at least one Correlated Electron Switch (CES).

BACKGROUND

Programmable impeders, such as resistor chains, can be utilized in a number of analog signal processing applications such as resistive ladders in digital to analog converters and as resistor arrays in neural networks. Various techniques have been provided for programming resistor chains; however, uncertainty in programming voltages and currents is a common occurrence in such programming techniques.

SUMMARY

According to a first aspect of the present techniques, there is provided a circuit comprising: a plurality of Correlated Electron Switches (CESs) arranged to form a configurable impeder, wherein each CES is capable of being configured to one of a plurality of impedance states; and at least one programing circuit configured to provide a plurality of programing signals each dependent on at least one input signal, wherein each programing signal configures an impedance state of a CES.

In embodiments, the at least one programing circuit comprises a plurality of programing circuits, each programing circuit configured to provide one of the plurality of programing signals.

The plurality of impedance states may comprise a first impedance state and a second impedance state. In embodiments, each programing circuit comprises: a first driving circuit to provide a first programing signal to configure the CES into the first impedance state; and a second driving circuit to provide a second programing signal to configure the CES into the second impedance state, wherein one of the first programing signal and the second programing signal is dependent on the at least one input signal.

The circuit may further comprise logic circuitry coupled to the or each programing circuit and arranged to enable the programming circuit to provide the respective programing signals dependent on the at least one input signal.

The circuit may further comprise a control circuit configured to: receive the least one input signal; and provide at least one control signal to the at least one programing circuit dependent on the at least one input signal, wherein the at least one programing circuit provides the plurality of programing signals dependent on the at least one control signal.

In embodiments, the at least one programing circuit provides the plurality of programing signals such that the impedance state of one CES is configured while keeping the impedance state of at least one other CES unchanged. Additionally or alternatively, the at least one programing circuit provides the plurality of programing signals such that the impedance state of two or more CESs is configured while keeping the impedance states of remaining CESs of the plurality of CESs unchanged.

The plurality of impedance states may comprise (at least) a high impedance state and a low impedance state.

In a second aspect of the present techniques, there is provided a method of configuring the impedance of a configurable impeder, the configurable impeder comprising a plurality of Correlated Electron Switches (CESs), the method comprising: receiving at least one input signal; determining at least one programming signal dependent on the at least one input signal, wherein the or each programming signal configures an impedance state of one or more CESs of the plurality of CESs; and applying the programming signal to one or more CESs of the plurality of CESs to configure the impedance state of the or each CES.

Applying the programming signal to a CES may comprise keeping the impedance state of at least one other CES of the plurality of CESs unchanged. Additionally or alternatively, applying the programming signal to a CES may comprise keeping the impedance states of remaining CESs unchanged.

In embodiments, applying the programming signal comprises configuring a CES into one of a plurality of impedance states. The plurality of impedances states may comprise a high impedance state and a low impedance state.

In a third aspect of the present techniques, there is provided a digital to analog converter (DAC) circuit comprising: a plurality of data inputs configured to receive a plurality of digital input signals; a plurality of Correlated Electron Switches (CESs), each CES of the plurality of CESs being configurable in one impedance state of a plurality of impedance states dependent on the plurality of digital input signals; and at least one output configured to output at least one analog output signal, the or each analog output signal being dependent upon the impedance states of the plurality of CESs.

The DAC may comprise a control circuit configured to: receive at least one input signal, wherein the at least one input signal is a write signal; provide a plurality of programing signals to the plurality of CESs dependent on the plurality of digital input signals, each programing signal configuring the impedance state of a CES.

The DAC may comprise a control circuit configured to: receive at least one input signal, wherein the at least one input signal is a read signal; and provide a reference signal to the plurality of CESs to output the at least one analog output signal.

The plurality of impedance states comprises at least a low impedance state and a high impedance state.

BRIEF DESCRIPTION OF THE DRAWINGS

The techniques are diagrammatically illustrated, by way of example, in the accompanying drawings, in which.

DETAILED DESCRIPTION

Figure 1:
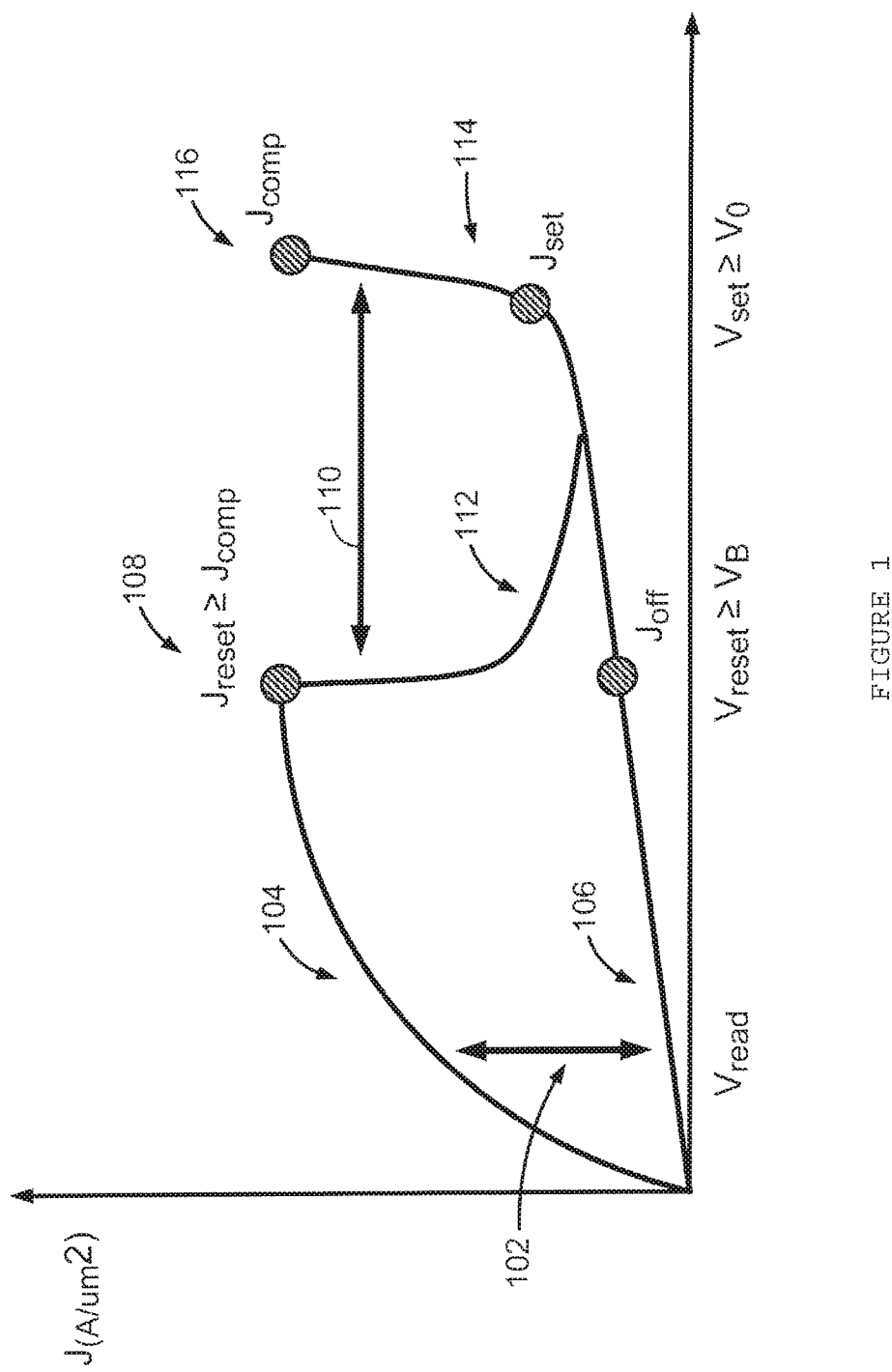
FIG. 1 shows a plot of current density versus voltage for a Correlated Electron Switch (CES) element.

Broadly speaking, embodiments of the present techniques provide . . . may be a Correlated Electron Switch (CES) element, which comprises a correlated electron material (CEM). The CES may be used both as non volatile storage as well as a circuit element that can enable connectivity in a circuit. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

Non-volatile memories are a class of memory in which the memory cell or element does not lose its state after power supplied to the device is removed. In flash memory devices, an ability to keep random access (erase/write single bits) was sacrificed for speed and higher bit density. Flash remains a non-volatile memory of choice. Nevertheless, it is generally recognized that flash memory technology may not scale easily below 40 nanometers (nm); thus, new non-volatile memory devices capable of being scaled to smaller sizes are actively being sought.

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows a plot of current density versus voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$ required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element of FIG. 1 may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state, and a portion 104 of the plot of FIG. 1 while the CES element is in a conductive state at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|V_{set}|>|V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 2:
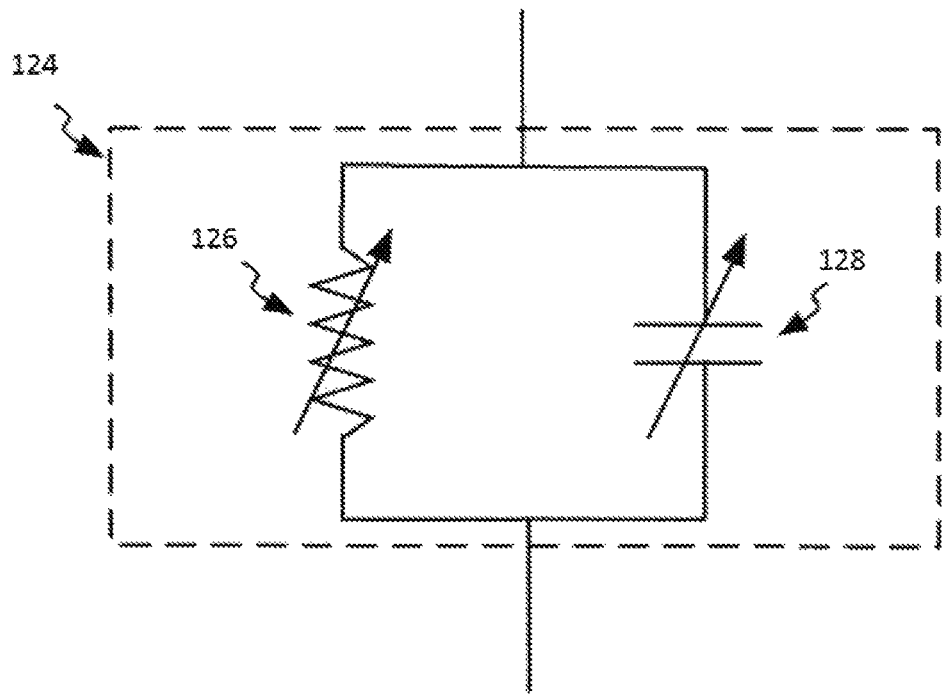
FIG. 2 is a schematic diagram of an equivalent circuit to a CES device.

FIG. 2 depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 2 as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
| --- | --- | --- |
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

Figure 3:
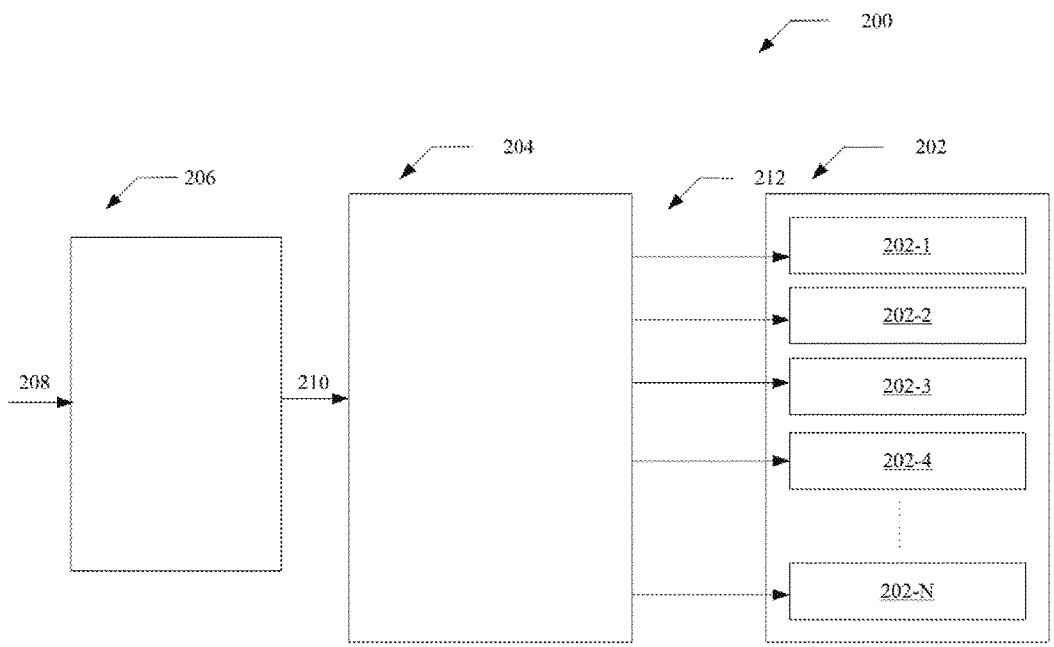
FIG. 3 is a schematic diagram of an example configurable impeder circuit.

FIG. 3 illustrates an overview of an example configurable impeder circuit 200, in accordance with an embodiment of the present disclosure. The circuit 200 includes a configurable impeder 202, a programing circuit 204, and a control circuit 206. In an implementation, the configurable impeder 202 may include a plurality of Correlated Electron Switches (CESs) 202-1 to 202-N (collectively referred to as the plurality of CESs 202) arranged to provide configurable impedance. According to one example implementation, the CESs 202-1 to 202-N are connected in series to form an array. It should be appreciated that the CESs 202-1 to 202-N may also be arranged in any other configuration to get a desired configurable impeder circuit. In the embodiment shown in FIG. 3, a single programing circuit may be coupled to a plurality of CESs. However, in alternate embodiments, each CES may be coupled to a respective programing circuit.

Referring back to FIG. 3, the control circuit 206 may receive at least one input signal 208. The input signal 208, in an example, may be a binary signal to be written into one or more of the plurality of CESs 202 when programing the one or more of the plurality of CESs 202 into one of a plurality of impedance states. In another example, the input signal 208 may include a plurality of binary signals to control programing of a respective one of the plurality of CESs 202 into one of the plurality of impedance states. In an example, the impedance state may be a resistive state, a capacitive state or a combination thereof. The resistive state may be one of a low resistance state (a SET state) and a high resistance state (a RESET state).

As further illustrated, the programing circuit 204 may receive a control signal 210 from the control circuit 206. The programing circuit 204 may provide a plurality of programing signals 212 to the plurality of CESs 202, based on the control signal 210. The plurality of programing signals 208 may be configured to program one or more of the plurality of CESs 202 in one of the plurality of impedance states. In an implementation, the programing signals 212 may program one or more CESs 202 based on the input signal 208.

Figure 4:
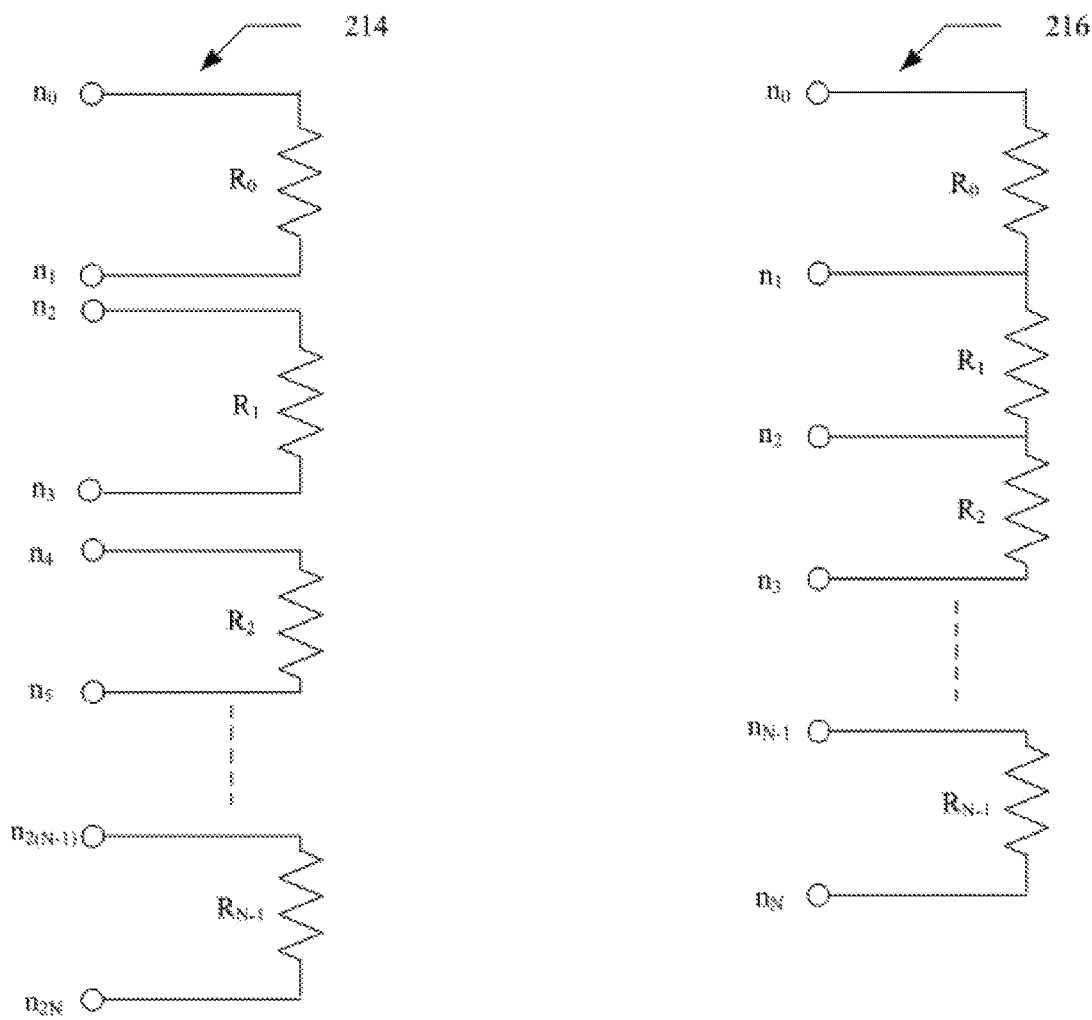
FIG. 4 illustrates exemplary configurations of the configurable impeder.

FIG. 4 illustrates two exemplary configurations of how the plurality of CESs 202 may be arranged to form the configurable impeder 202, in accordance with an embodiment of the present disclosure. As shown, a first configuration 214 depicts each CES (denoted by $R_0$-$R_{N-1}$) connected between two nodes. For example, $R_0$ is shown connected between nodes $n_0$ and $n_1$. Further, no CES has a common node with another CES. The first configuration 214 may therefore have a total of 2N nodes connecting N CESs. In such a configuration, the CESs may be programed by providing appropriate programming signals across respective nodes. Further, the programed CESs may be connected in a desirable configuration so as to get a configurable impedance value at output.

A second configuration 216 as shown, connects each CES between two nodes such that one node is always common between two connected CESs. For example, CES $R_0$ is shown connected between nodes $n_0$ and $n_1$ and $R_1$ is connected between node $n_1$ and $n_2$. Thus, $R_0$ and $R_1$ have a common node, i.e., $n_1$. Such a configuration may thus have N nodes for connecting N CESs.

Figure 5:
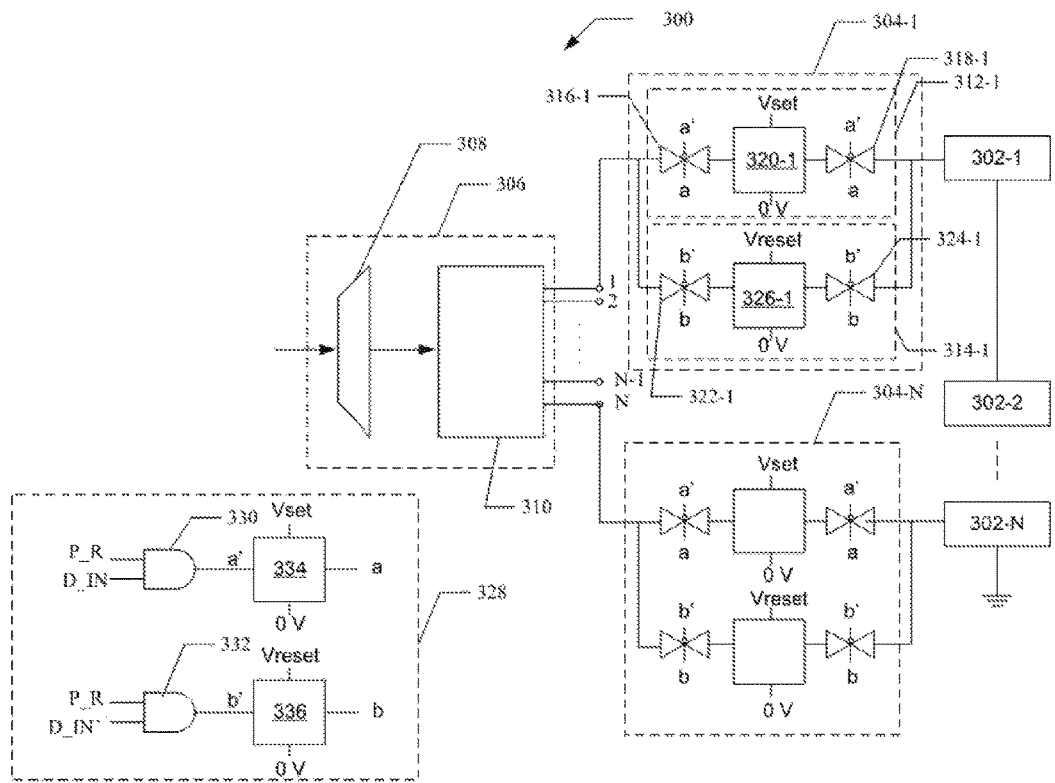
FIG. 5 illustrates an example circuit for programming a CES using a plurality of CESs.

FIG. 5 illustrates an exemplary circuit 300 for programing a CES from a plurality of CESs, in accordance with an embodiment of the present disclosure. The illustrated example depicts the circuit arrangement 300 including N CESs 302-1 . . . 302-N, referred collectively as CESs 302. The CESs 302, in an example, may be electrically arranged as depicted by the second configuration 216, in FIG. 4.

Each CeRAM element 302 is coupled to a programing circuit 304 (illustrated as 304-1 . . . 304-N), referred collectively as programing circuits 304. As depicted, each of the programing circuits 304 may be coupled to a logic circuitry 306, through respective nodes depicted as node 1, node 2, and so on till node N. The logic circuitry 306 may include a decoder 308 and an OR gate array 310. In an implementation, the decoder 308 may receive have $\log_2 N$ inputs. The decoder 308 may generate N digital outputs based on the $\log_2 N$ inputs. The N digital outputs may be fed as N inputs to the OR gate array 310. The OR gate array 310 may generate N select signals based on the N inputs.

Each programing circuit 304-N may include a first driving circuit 312-N and a second driving circuit 314-N. The first driving circuit 312 may be configured to program a respective CES to a first resistive state. The second driving circuit 314 may be configured to the program the CES into a second resistive state. The first driving circuit 312, as depicted, includes transmission gates 316, 318 and a first level shifter 320. Similarly, the second driver circuit 314 includes transmission gates 322, 324 and a second level shifter 326.

In an implementation, the programing signal to activate one of the first driving circuit 312 or the second driving circuit 314 to program the respective CES 302 may be controlled by a control circuit 328. The control circuit 328 may include a first AND gate 330 and a second AND gate 332. An output of the first AND gate 330 is coupled to a level shifter 334 and an output of the second AND gate 332 is coupled to a level shifter 336. The level shifters 334, 336 may be configured to provide sufficient voltage for programming the CES in a desired impedance state. The logical implementation of the control circuit 328 is further explained with respect to Table 2. In one implementation, data input (D_IN), as shown in the table, may be the input signal 208, as described in reference to FIG. 3. Further, P_R may be a program/read signal.

TABLE 2

Operation of the control circuit 328.

| Operation | P_R | D_IN | a | b |
|---|---|---|---|---|
| Reset | 1 | 0 | 0 | 1 |
| Set | 1 | 1 | 1 | 0 |
| Read | 0 | 0 | 0 | 0 |
| Read | 0 | 1 | 0 | 0 |

As depicted in Table 2, for programing the CES 302 into the RESET state, P_R may be set to logic one and D_IN may be set to logic zero. As shown, the output of the AND gate 330 (denoted by a') is logic zero and the output of the AND gate 332 (denoted by b') is logic one. Consequently, the transmission gates 322 and 324 are activated and the level shifter 326 provides an appropriate programing signal (for example, appropriate voltage and/or current) to program the CES 302 into the RESET state, i.e., the high resistance state.

Further, to program the CES 302 into the SET state, i.e., the low resistance state, P_R may be set to logic one and D_IN may also be set to logic one. Based on the above table, the output of the AND gate 330 is given by logic one and the output of the AND gate 332 is given by logic zero. Thus, the transmission gates 316 and 318 are activated enabling the level shifter 320 to provide an appropriate programing voltage to program the CES 302 into the SET state, i.e., the low resistance state. As further shown in Table 2, when the CES 302 undergoes a read process, the P_R inputs are set to zero for both the AND gates of the control circuit 328, thus deactivating all the transmission gates of the programing circuit 304.

As shown in the FIG. 5, each CES 302 is coupled to a programing circuit 304 through a respective node. In an implementation, the output from the OR gate array 310 may select one of the programing circuits 304 to program the respective CES 302, such that resistive states of all other CESs remain unchanged. That is, only one CES from the CESs 304 may be programed to a high resistance state or a low resistance state, keeping resistive states of other CESs unchanged.

Figure 6:
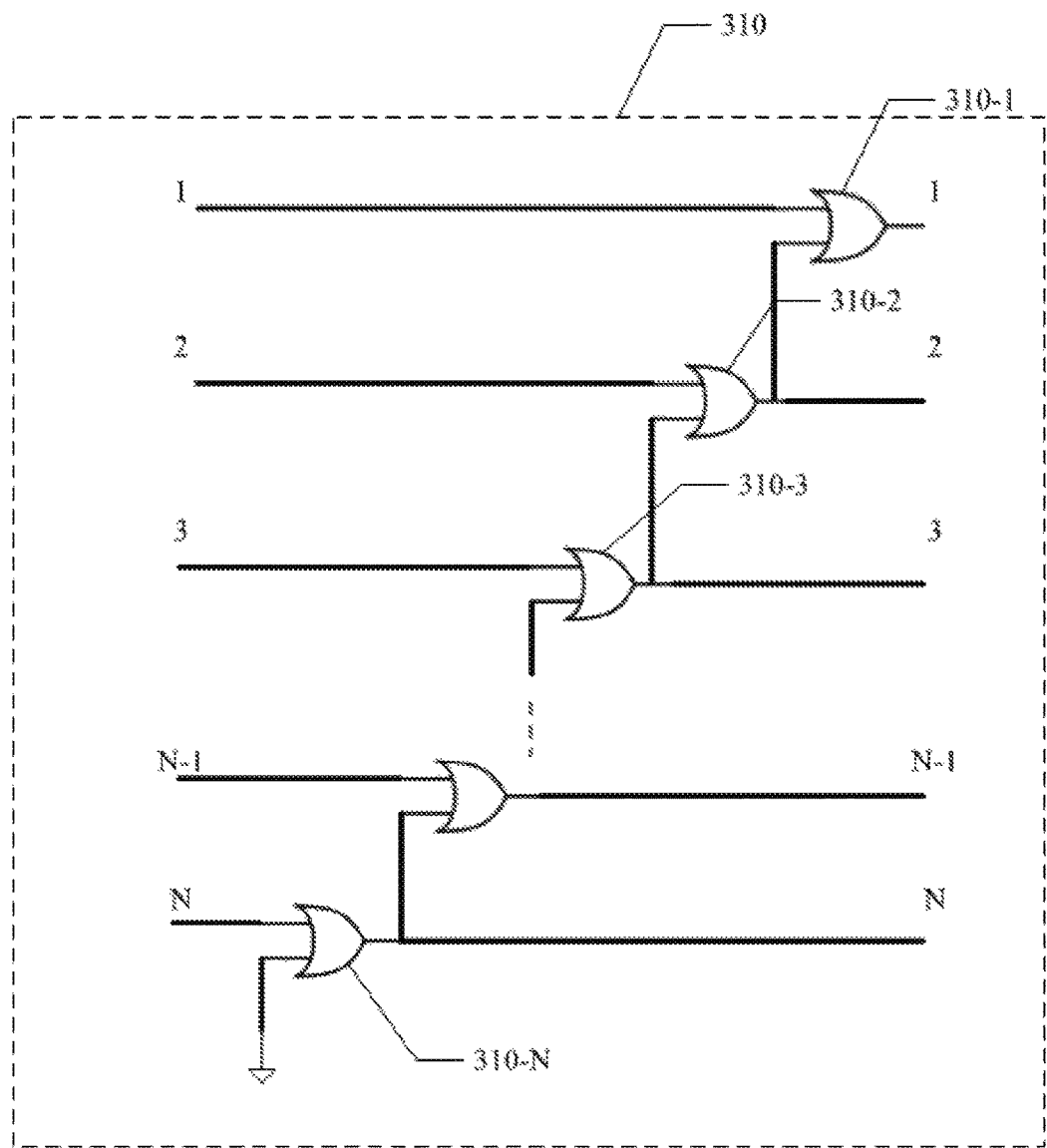
FIG. 6 illustrates an exemplary OR gate array.

FIG. 6 illustrates the OR gate array 310 in detail, in accordance with an embodiment of the present disclosure. As depicted, the OR gate array 310 may comprise of N OR gates 310-1, 310-2, 310-3 and so on. The OR gates are coupled such that each OR gate receives a signal from a decoder, such as the decoder 308 described in FIG. 5. The decoder 308, in an example, may be an N-bit decoder, such that the decoder 308 provides an N-bit output to the OR gate array 310 based on the select signals. Further, the OR gate array 310 may also comprise an N-bit input (denoted by numerals 1-N), such that each logical bit of the N-bit output from the decoder 308, may be received by a respective OR gate. In an implementation, N-bit output of the decoder 308 may drive the N-bit input of the OR gate array 310, such that all output terminals above a selected output are high and other output terminals are at ground. Based on the logic bit received by the active outputs, the programing circuit 304 may program a respective CES into a low resistance state or a high resistance state.

Taking an example, if a CES 302-3 (not shown) has to be programed in a high resistance state, based on Table 2, the P_R signal may be set to logic 1 and the D_IN signal may be set to logic 0. Based on the output of the control circuit 328, a second driving circuit 314-3 may be activated, i.e., transmission gates 322-3 and 324-3 may and level shifter 326-3 (not shown) may be activated. The CES 302-3 may thus be programed in the high resistance state. Further, to this end, selection of the programing circuit 304-3 (not shown) may be necessary. Furthermore, all other programing circuits of the circuit arrangement may be selected in a way that respective CESs may not change their impedance states. To attain this, appropriate input signals may be fed to the decoder 308, as described above. Based on the input signals, the OR gate array 310 may generate appropriate select signal such that CES 302-3 may be programed to the high resistance state, leaving all other CES states unchanged.

Figure 7:
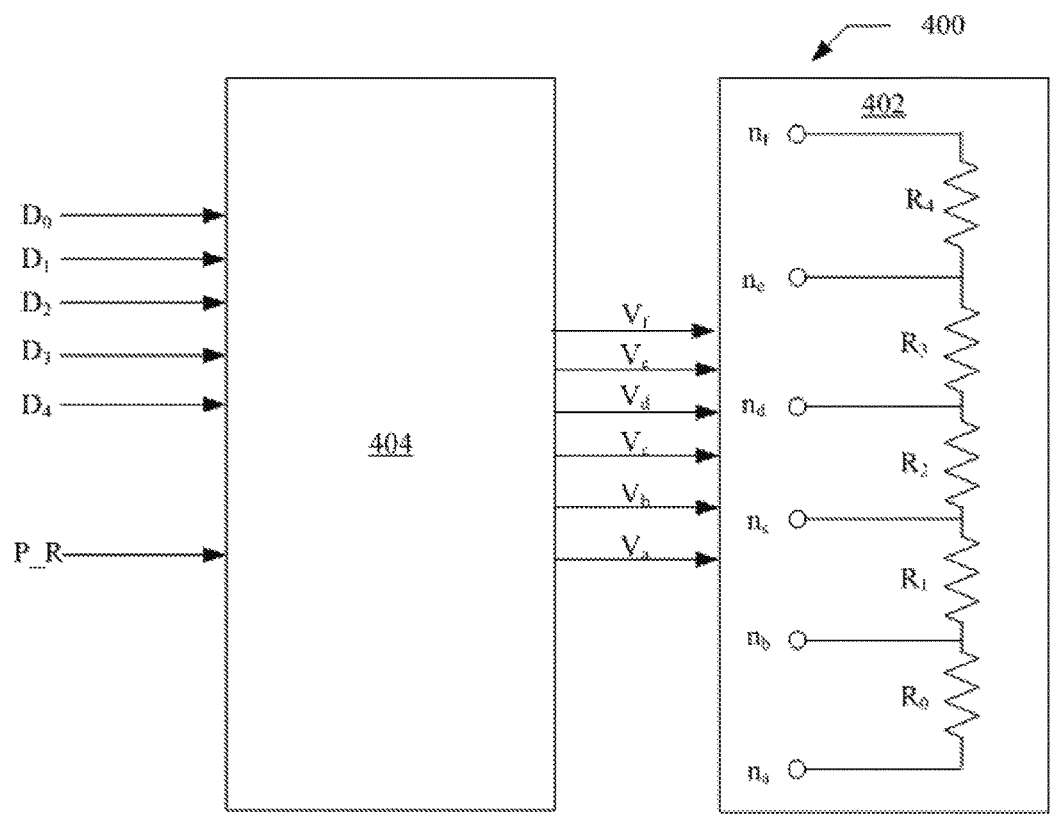
FIG. 7 illustrates an example circuit for programing multiple CESs simultaneously.

Is FIG. 7 illustrates a circuit arrangement 400 for simultaneously programing multiple CESs, in accordance with an embodiment of the present disclosure. As depicted, the circuit arrangement 400 comprises a configurable impeder 402 comprising of five programmable CESs as depicted by $R_0$-$R_4$. The CESs may be coupled to each other in series in a manner that each CES is coupled to another CES, through a node. The nodes are depicted in the fig. by $n_a$-$n_f$. Each node may be connected to a node voltage ($V_a$-$V_f$). Further, each CES may be connected between two nodes such that the difference of the node voltages of the two nodes represents voltage drop across the CES. For example, difference between node voltages for nodes $n_a$ and $n_b$ gives the voltage drop across the CES $R_0$. The voltage drop across the CES acts as a programing voltage for the CES.

In an implementation, the configurable impeder 402 may be connected to a programing circuit 404, such that the plurality of programmable CESs of the configurable impeder 402 are simultaneously programed based on signals received from the programing circuit 404. Further, even though the CESs are programed simultaneously, each of the CESs may be programed into the low resistance state or the high resistance state. In one implementation, the programing circuit 404 may provide programing signals to the configurable impeder 402 based on a plurality of data inputs (denoted by $D_0$-$D_4$). A program/read input (P_R), in an example, may be kept at logic one while programing the CESs. The plurality of data inputs may be fed into the programing circuit 402 and converted to appropriate node voltages to program the plurality of programmable CESs of the configurable impeder 402. An exemplary set of node voltages required to program the plurality of programmable CESs is given in Table 3 below:

TABLE 3

Programing multiple CESs simultaneously.

| State # | Node Voltages | | | | | | State | | | | |
|---|---|---|---|---|---|---|---|---|---|---|---|
| | $n_f$ | $n_e$ | $n_d$ | $n_c$ | $n_b$ | $n_a$ | $R_4$ | $R_3$ | $R_2$ | $R_1$ | $R_0$ |
| 0 | 0 | 0.6 | 0 | 0.6 | 0 | 0.6 | 0 | 0 | 0 | 0 | 0 |
| 1 | 0 | 0.6 | 0 | 0.6 | 0 | 1.2 | 0 | 0 | 0 | 0 | 1 |
| 2 | 0.6 | 1.2 | 0.6 | 1.2 | 0 | 0.6 | 0 | 0 | 0 | 1 | 0 |
| 3 | 0.6 | 1.2 | 0.6 | 1.2 | 0 | 1.2 | 0 | 0 | 0 | 1 | 1 |
| 4 | 0 | 0.6 | 0 | 1.2 | 0.6 | 1.2 | 0 | 0 | 1 | 0 | 0 |
| 5 | 0 | 0.6 | 0 | 1.2 | 0.6 | 1.8 | 0 | 0 | 1 | 0 | 1 |
| 6 | 0 | 0.6 | 0 | 1.2 | 0 | 0.6 | 0 | 0 | 1 | 1 | 0 |
| 7 | 0 | 0.6 | 0 | 1.2 | 0 | 1.2 | 0 | 0 | 1 | 1 | 1 |

TABLE 3-continued

Programing multiple CESs simultaneously.

| State # | Node Voltages | | | | | | State | | | | |
|---|---|---|---|---|---|---|---|---|---|---|---|
| | $n_f$ | $n_e$ | $n_d$ | $n_c$ | $n_b$ | $n_a$ | $R_4$ | $R_3$ | $R_2$ | $R_1$ | $R_0$ |
| 8 | 0.6 | 1.2 | 0 | 0.6 | 0 | 0.6 | 0 | 1 | 0 | 0 | 0 |
| 9 | 0.6 | 1.2 | 0 | 0.6 | 0 | 1.2 | 0 | 1 | 0 | 0 | 1 |
| 10 | 1.2 | 1.8 | 0.6 | 1.2 | 0 | 0.6 | 0 | 1 | 0 | 1 | 0 |
| 11 | 1.2 | 1.8 | 0.6 | 1.2 | 0 | 1.2 | 0 | 1 | 0 | 1 | 1 |
| 12 | 0.6 | 1.2 | 0 | 1.2 | 0.6 | 1.2 | 0 | 1 | 1 | 0 | 0 |
| 13 | 0.6 | 1.2 | 0 | 1.2 | 0.6 | 1.8 | 0 | 1 | 1 | 0 | 1 |
| 14 | 0.6 | 1.2 | 0 | 1.2 | 0 | 0.6 | 0 | 1 | 1 | 1 | 0 |
| 15 | 0.6 | 1.2 | 0 | 1.2 | 0 | 1.2 | 0 | 1 | 1 | 1 | 1 |
| 16 | 0 | 1.2 | 0.6 | 1.2 | 0.6 | 1.2 | 1 | 0 | 0 | 0 | 0 |
| 17 | 0 | 1.2 | 0.6 | 1.2 | 0.6 | 1.8 | 1 | 0 | 0 | 0 | 1 |
| 18 | 0 | 1.2 | 0.6 | 1.2 | 0 | 0.6 | 1 | 0 | 0 | 1 | 0 |
| 19 | 0 | 1.2 | 0.6 | 1.2 | 0 | 1.2 | 1 | 0 | 0 | 1 | 1 |
| 20 | 0 | 1.2 | 0.6 | 1.8 | 1.2 | 1.8 | 1 | 0 | 1 | 0 | 0 |
| 21 | 0 | 1.2 | 0.6 | 1.8 | 1.2 | 2.4 | 1 | 0 | 1 | 0 | 1 |
| 22 | 0 | 1.2 | 0.6 | 1.8 | 0.6 | 1.2 | 1 | 0 | 1 | 1 | 0 |
| 23 | 0 | 1.2 | 0.6 | 1.8 | 0.6 | 1.8 | 1 | 0 | 1 | 1 | 1 |
| 24 | 0 | 1.2 | 0 | 0.6 | 0 | 0.6 | 1 | 1 | 0 | 0 | 0 |
| 25 | 0 | 1.2 | 0 | 0.6 | 0 | 1.2 | 1 | 1 | 0 | 0 | 1 |
| 26 | 0.6 | 1.8 | 0.6 | 1.2 | 0 | 0.6 | 1 | 1 | 0 | 1 | 0 |
| 27 | 0.6 | 1.8 | 0.6 | 1.2 | 0 | 1.2 | 1 | 1 | 0 | 1 | 1 |
| 28 | 0 | 1.2 | 0 | 1.2 | 0.6 | 1.2 | 1 | 1 | 1 | 0 | 0 |
| 29 | 0 | 1.2 | 0 | 1.2 | 0.6 | 1.8 | 1 | 1 | 1 | 0 | 1 |
| 30 | 0 | 1.2 | 0 | 1.2 | 0 | 0.6 | 1 | 1 | 1 | 1 | 0 |
| 31 | 0 | 1.2 | 0 | 1.2 | 0 | 1.2 | 1 | 1 | 1 | 1 | 1 |

As depicted in Table 3, each node may be provided a specific node voltage, but it will be understood that the depicted voltages are merely illustrative and non-limiting. As illustrated in an example, for each CES, a CES may be programed to a high resistance state when a corresponding digital input signal is at logic zero and programed to a low resistive state when the corresponding digital input signal is at logic one. This example is described for illustrative purposes only and it may be possible that a logic zero may be represented by a low resistance state and a logic one may be represented by a high resistance state. In that case, the node voltages are generated accordingly. Furthermore, it may be assumed, that an approximate voltage of 1.2 volts ($V_{set}$) may be required to program the CES in the SET state and an approximate voltage of 0.6 volts ($V_{reset}$) may be required to program the CES in the RESET state.

Referring back to FIG. 7, each CES may be connected between two nodes such that the difference of the node voltages of the two nodes represents voltage drop across the CES. For example, difference between node voltages for nodes $n_a$ and $n_b$ gives the voltage drop across the CES $R_0$. The voltage drop across the CES acts as a programing voltage for the CES.

In the example shown in Table 3, state# 0 shows each of the CESs to be in the high resistance state. For the CESs to be programed in the state# 0, corresponding node voltages for nodes $n_a$-$n_f$ are given as 0.6V, 0V, 0.6V, 0V, 0.6V and 0V respectively. In state#1, $R_0$ is in the low resistance state and all other CESs are in the high resistance state. The corresponding node voltages for nodes $n_a$-$n_f$ are given by 1.2V, 0V, 0.6V, 0V, 0.6V and 0V respectively. Thus, by choosing appropriate node voltages and node currents applied on the nodes, multiple CESs may be programed in different resistive states simultaneously.

As depicted in Table 3, a total of five supply voltages, i.e., 0V, 0.6V, 1.2V, 1.8V and 2.4V are required to realize all different programing states for the CESs. In an embodiment, when the number of CESs to be programed is odd, one supply voltage may be saved by making one of the programing states invalid, thus saving on circuitry used for generating the supply voltage. Referring back to Table 3, state# 21 shows a node voltage at node $n_a$ as 2.4 volts. In an implementation, if state# 21 is eliminated, a node voltage of 2.4 volts may no longer be required. This would thus save power and area required on the circuitry that is used to generate the node voltages. Further, in another embodiment, by changing the node voltage at node $n_a$ from 2.4 volts to 0 volts, $R_0$ may still be programed to a low resistance state. This may be done by using a positive $V_{set}$ voltage difference for node voltages of nodes $n_b$ and $n_a$, rather than a negative $V_{set}$ difference used previously when 2.4V was applied to node $n_a$.

The example illustrated herein is described using uni-direction CESs to implement the configurable impeder. In an embodiment, the configurable impeder may be implemented using bi-directional CESs. Programming a bi-directional switching CES depend only values of the programing voltages and currents and is independent of the polarities of voltages and direction of currents used for the programming. Non-dependence on polarities of the programing voltages and current may simplify a control scheme for programing the CES. In an embodiment, a combination of uni-directional and bi-directional CESs may be used with appropriate control voltages and currents.

In an embodiment, voltage control for controlling the node voltages may be realized using a multiplexer. In an example, for programing multiple CESs simultaneously, an 8-1 multiplexer may be coupled to each node. Digital select signals for the 8-1 multiplexer for controlling the node voltages is shown in details in Table 4 below.

TABLE 4

8-1 Multiplexer select signals for controlling node voltages.

| Select Signals for the Multiplexer | Associated Voltages |
|---|---|
| 000 | $V_{SS}$ (0 V) |
| 001 | $V_{reset}$ (0.6 V) |
| 010 | $V_{set1}$ (1.2 V) |
| 011 | $V_{set2}$ (1.8 V) |
| 100 | $V_{read}$ (0.4 V) |
| 101 | Open |
| 110 | Open |
| 111 | Open |

As shown in Table 4, the 8-1 multiplexer may provide four different voltages required to program multiple CESs simultaneously, but it will be understood that the depicted voltages are merely illustrative and non-limiting. In an implementation, each node may be coupled to a multiplexer such that the multiplexer may provide required node voltage to the node. For example, based on Table 4, for a node voltage of 0.6 volts at a node, the multiplexer may provide a select signal given by binary 001 to the node. Similarly, a binary 000 may provide a node voltage equaling 0 volts. Table 5 illustrates an example where four CESs are programed simultaneously using select signals received from multiplexers.

TABLE 5

Truth table for programing multiple CESs simultaneously.

| | Node Voltage | | | | | CES Resistance State | | | | Digital Input | | | | Mux Select Signals | |
|---|---|---|---|---|---|---|---|---|---|---|---|---|---|---|---|
| State # | $n_e$ | $n_d$ | $n_c$ | $n_b$ | $n_a$ | $R_3$ | $R_2$ | $R_1$ | $R_0$ | $D_3$ | $D_2$ | $D_1$ | $D_0$ | $n_a$ | $n_b$ |
| 1 | 0.6 | 0 | 0.6 | 0 | 0.6 | 1 | 1 | 1 | 1 | 0 | 0 | 0 | 0 | 001 | 000 |
| 2 | 0.6 | 0 | 0.6 | 0 | 1.2 | 1 | 1 | 1 | 0 | 0 | 0 | 0 | 1 | 010 | 000 |
| 3 | 1.2 | 0.6 | 1.2 | 0 | 0.6 | 1 | 1 | 0 | 1 | 0 | 0 | 1 | 0 | 001 | 000 |
| 4 | 1.2 | 0.6 | 1.2 | 0 | 1.2 | 1 | 1 | 0 | 0 | 0 | 0 | 1 | 1 | 010 | 000 |
| 5 | 0.6 | 0 | 1.2 | 0.6 | 1.2 | 1 | 0 | 1 | 1 | 0 | 1 | 0 | 0 | 010 | 001 |
| 6 | 0.6 | 0 | 1.2 | 0.6 | 1.8 | 1 | 0 | 1 | 0 | 0 | 1 | 0 | 1 | 011 | 001 |
| 7 | 0.6 | 0 | 1.2 | 0 | 0.6 | 1 | 0 | 0 | 1 | 0 | 1 | 1 | 0 | 001 | 000 |
| 8 | 0.6 | 0 | 1.2 | 0 | 1.2 | 1 | 0 | 0 | 0 | 0 | 1 | 1 | 1 | 010 | 000 |
| 9 | 1.2 | 0 | 0.6 | 0 | 0.6 | 0 | 1 | 1 | 1 | 1 | 0 | 0 | 0 | 001 | 000 |
| 10 | 1.2 | 0 | 0.6 | 0 | 1.2 | 0 | 1 | 1 | 0 | 1 | 0 | 0 | 1 | 010 | 000 |
| 11 | 1.8 | 0.6 | 1.2 | 0 | 0.6 | 0 | 1 | 0 | 1 | 1 | 0 | 1 | 0 | 001 | 000 |
| 12 | 1.8 | 0.6 | 1.2 | 0 | 1.2 | 0 | 1 | 0 | 0 | 1 | 0 | 1 | 1 | 010 | 000 |
| 13 | 1.2 | 0 | 1.2 | 0.6 | 1.2 | 0 | 0 | 1 | 1 | 1 | 1 | 0 | 0 | 010 | 001 |
| 14 | 1.2 | 0 | 1.2 | 0.6 | 1.8 | 0 | 0 | 1 | 0 | 1 | 1 | 0 | 1 | 011 | 001 |
| 15 | 1.2 | 0 | 1.2 | 0 | 0.6 | 0 | 0 | 0 | 1 | 1 | 1 | 1 | 0 | 001 | 000 |
| 16 | 1.2 | 0 | 1.2 | 0 | 1.2 | 0 | 0 | 0 | 0 | 1 | 1 | 1 | 1 | 010 | 000 |
| 17 | 0.4 | Z | Z | Z | 0 | X | X | X | X | X | X | X | X | 000 | 101 |

As shown in Table 5, for programing multiple CESs in the high resistance state or the low resistance state, different select signals from the multiplexer may be fed into each node to obtain appropriate node voltages, but it will be understood that the depicted voltages are merely illustrative and non-limiting. For example, as shown in state# 1, each of the four CESs, i.e., $R_0$, $R_1$, $R_2$ and $R_3$, are programed in a high resistance state. Further according to the table 4, for programing $R_0$ element into a high resistance state, node a ($n_a$) must have a node voltage of 0.6 volts and node b ($n_b$) must have a node voltage of 0 volts. To provide these voltages, a select signal of binary 001 may be fed to an 8-1 multiplexer associated with node $n_a$ and a select signal of binary 000 may be fed to an 8-1 multiplexer associated with node $n_b$. The node voltages on nodes $n_a$ and $n_b$ may be based on the scheme illustrated by Table 4. As can be seen, a binary 001 may provide for an output of 0.6 volts and a binary 000 may provide for an output of 0 volts. The difference in node voltages of nodes $n_b$ and $n_a$ may provide for programing voltage required to program the CES $R_0$ into a high resistance state. Table 5 depicts select signals fed into nodes $n_a$ and $n_b$ to generate node voltages. Select signals for other nodes, i.e., $n_c$, $n_d$, and $n_e$ may be generated in a similar manner. Further, the above arrangement for programing multiple CESs simultaneously is explained with respect to four CESs coupled to each other. However, in alternate embodiments, more than four CESs may also be programed simultaneously.

In one example, for a read operation, appropriate node voltages may be applied to the CESs, as shown in state #17 of Table 5. As depicted, for the read operation node $n_a$ must of a voltage of 0 volts and the node $n_e$ must have a voltage of 0.4 volts. Based on the scheme shown in table 3, to provide these voltages, a select signal of binary 000 may be fed to an 8-1 multiplexer associated with node $n_a$ and a select signal of binary 100 may be fed to an 8-1 multiplexer associated with node $n_e$. Further, all other nodes may either be disconnected or open, as denoted by "Z" in Table 5. Furthermore, digital inputs for the CESs, and consequently, resistance states of the CESs may assume any value, as depicted by "X" in Table 5. In one implementation, a voltage drop between $n_a$ and $n_e$ may be read. In another implementation, a fixed voltage may be applied and current between nodes $n_a$ and $n_e$ may be read.

In an embodiment, digital logic transformations may be used to generate programing circuitry from the above table, for programing multiple CESs. In another embodiment, voltage control for the node voltages may be built in register-transfer logic (RTL). In such an implementation, the control may be built in an "always" RTL block, fired by conditional "if" and/or "switch" statements.

Figure 8:
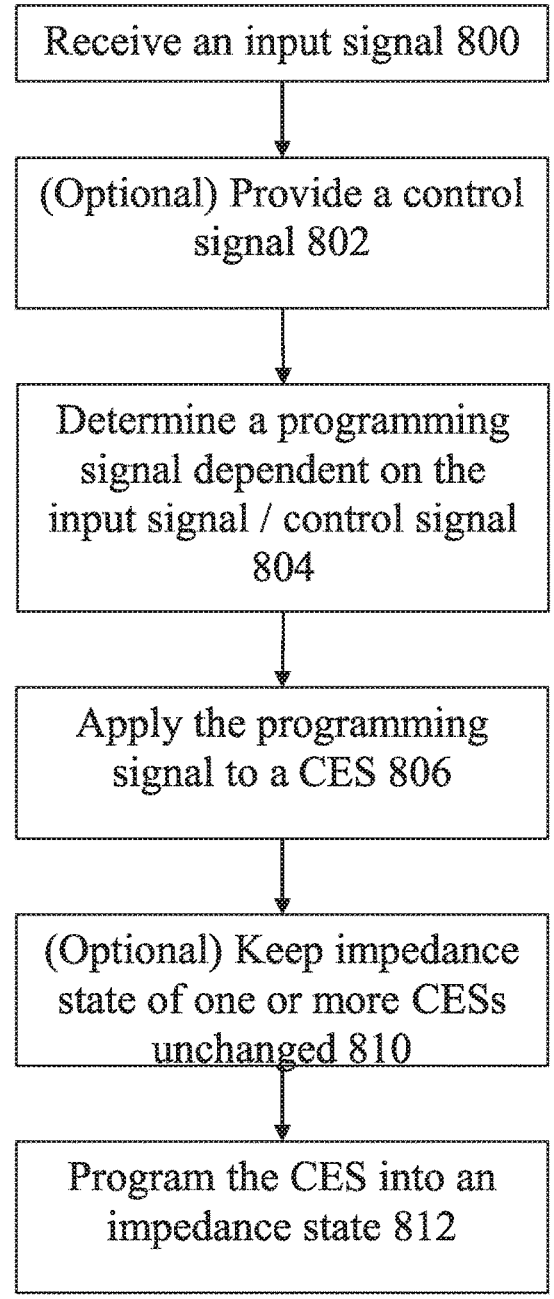
FIG. 8 illustrates an example method for providing a configurable impeder.

FIG. 8 illustrates an exemplary method 500 for programing a configurable impeder, in accordance with an embodiment of the present disclosure. The method may begin by providing a plurality of CESs arranged to form the configurable impeder. In an example, the plurality of CESs may be arranged in one of the configurations as depicted in FIGS. 3 and 4. Further, in one implementation, the configurable impeder may be a programmable resistor chain comprising the plurality of CESs. Furthermore, each of the plurality of CESs may be capable of being configured into one of a plurality of impedance states. The plurality of impedance states may comprise of a resistance state, a capacitive state, or a combination thereof. The resistive state may include a high resistance state and a low resistance state. The capacitive state may include a high capacitive state and a low capacitive state.

The method begins by receiving at least one input signal (step 800). Optionally, as described herein, the programming signal which configures the impedance state of the impeder may be dependent on the at least one input signal, or may be dependent on a control signal (which is itself dependent on the at least one input signal). Thus, optionally, a control signal may be provided (step 802). The method comprises determining a programming signal dependent on the input signal or the control signal (step 804). Once determined, the programming signal is applied to at least one of the CESs of the plurality of CESs that form the impeder (step 806) in order to configure the impedance state of the or each CES. Optionally, the impedance state of one or more CESs is held constant or kept unchanged while the programming signal is being applied (step 810). The CES is programmed into an impedance state (step 812) dependent on the at least one input signal. The input signal, in an example, may be a digital input signal. For example, when a digital input signal is at logic zero, a corresponding CES may be programed (by applying a programming signal) to a low impedance state, and when the digital input signal is at logic one, the corresponding CES may be programed (by applying a programming signal) to a high impedance state.

Figure 9:
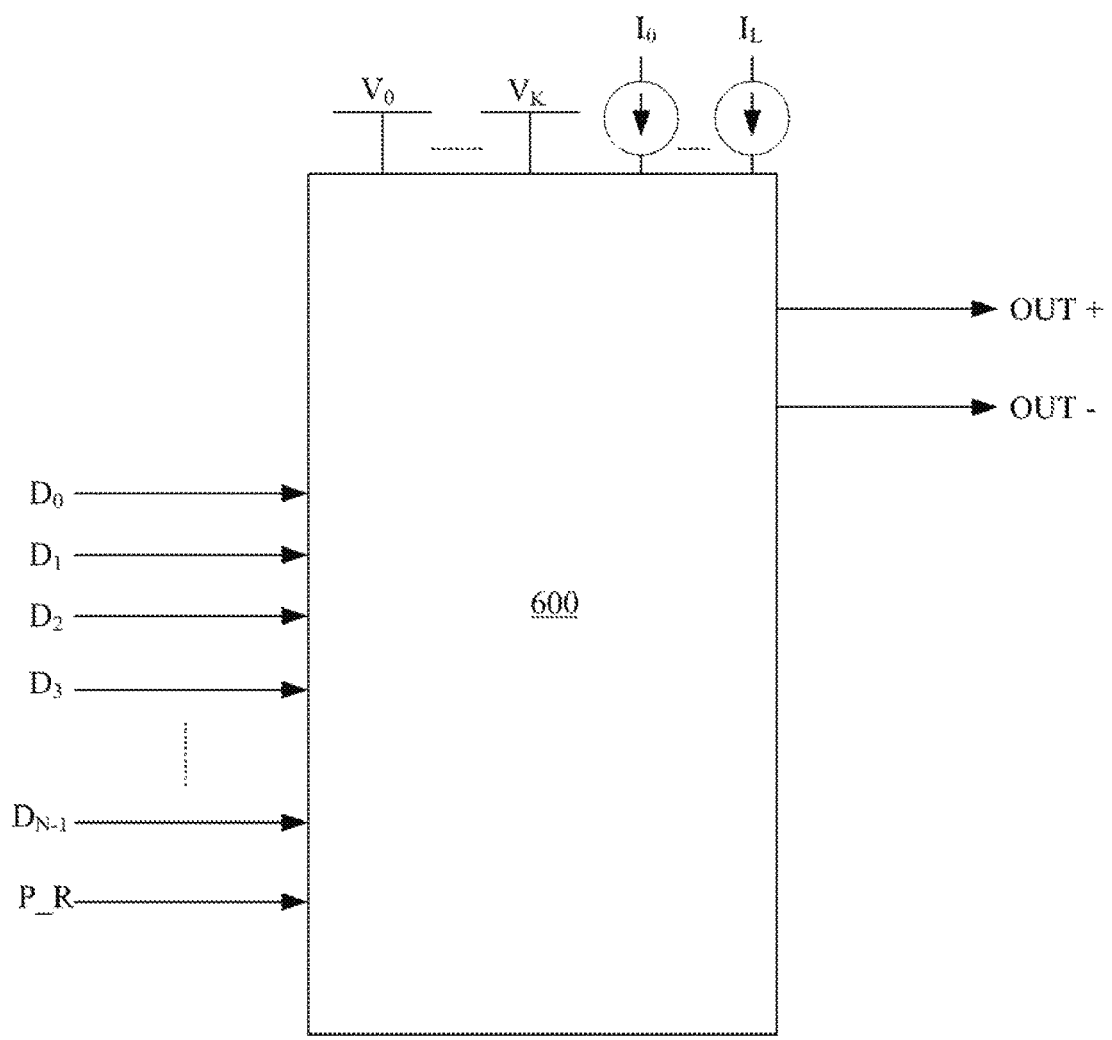
FIG. 9 illustrates an exemplary digital to analog converter (DAC)

FIG. 9 illustrates an exemplary digital to analog converter (DAC) 600, in accordance with an embodiment of the present disclosure. In an implementation, the DAC may include N CESs (not shown) coupled together. The N CESs may be coupled to each other using any one configuration as shown in FIG. 3 or 4.

The DAC 600 may further include N data inputs, denoted by $D_0$-$D_{N-1}$. The data inputs may be connected to digital input signals. The digital input signals may be binary. Further a program/read (P_R) input may be provided to program the plurality of CESs according to the corresponding digital input signals or read an analog signal at least one output (for example, a differential output signal at OUT+ and OUT−) of the DAC 600. For example, when the input is set to binary 1, a write process may be performed and when the P_R input is set to binary 0, a read process may be performed. Further, appropriate voltage sources, denoted by $V_0$-$V_K$ required to program the CESs may be provided. Similarly, appropriate current sources, denoted by $I_0$-$I_L$ may be provided. The appropriate voltages and currents, in an example, may be provided using an 8-1 multiplexer as described in FIG. 7.

In an implementation, during a read process, a fixed value of current may be passed from all the CESs through a first node and a last node (for example, $n_0$, and $n_N$ respectively). Further, all other nodes may be connected to the "disconnect" state the voltage drop between the first node and the last node may be read. In another implementation, a fixed voltage may be set up and a current through the first node and the last node may be measured. The value of current or voltage measured may be provided, in an example, at the analog output pins (given by OUT+ and OUT−).

Figure 10:
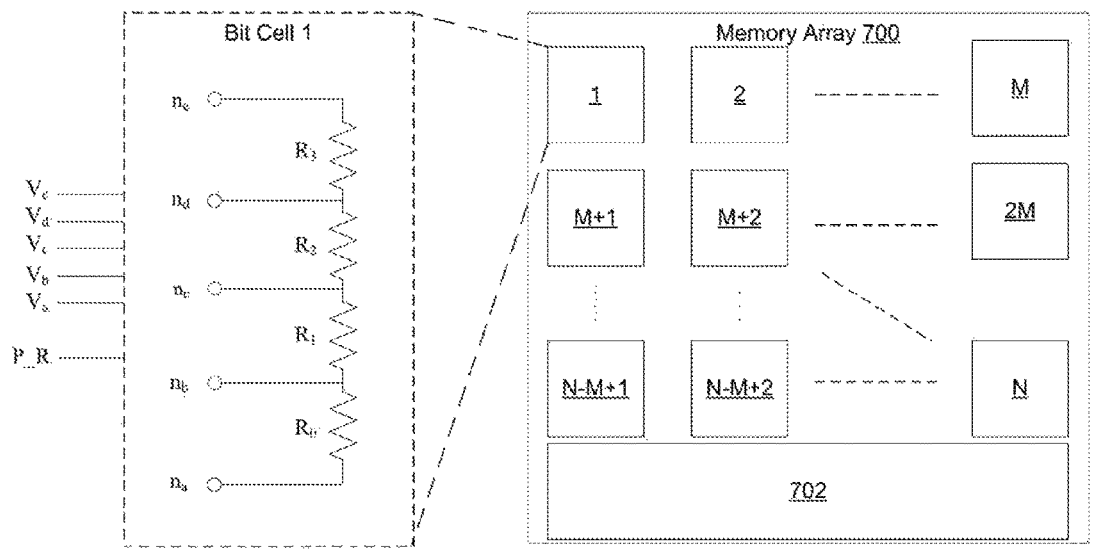
FIG. 10 illustrates an exemplary memory array comprising one or more CESs.

FIG. 10 illustrates an exemplary memory array 700, in accordance with an embodiment of the present disclosure. In this case, the memory array 700 stores data in analog format. The memory array 700 may include N bit cells, as depicted. Each of the bit cell may include a set of CESs (for example, $R_0$-$R_3$) connected between nodes (for example, $n_a$-$n_0$) to form a configurable resistor chain. For programming the bit cells of the memory array 700, digital data may be converted to appropriate node voltages ($V_a$-$V_e$) and fed to the nodes such that based on the node voltages, the digital data may be stored within the programmable CESs in the form of the resistor value of the configurable resistor chain formed by the CESs and hence, within the respective bit cell. The configurable resistor chain may be programed using any one of the embodiments described in the foregoing. Thus, the memory array 700 may use simultaneous programing of multiple CESs to store data within the bit cells.

In an implementation, when digital data is to be written within the bit cell, the program/read signal (P_R) may be at binary 1 and when digital data is to be read from the bit cell, the P_R signal may be at binary 0. The data may be read from the bit cell as analog data, as described in the foregoing. Further, a control element 702 may control data storage within the memory array 700.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

The invention claimed is:

1. A device comprising:
    a variable impeder device comprising a plurality of variable impedance elements connected in a series, each of the variable impedance elements being configurable to a non-volatile impedance state between or among a plurality of non-volatile impedance states, the variable plurality of variable impedance elements being connected at terminals to form a series connection of the plurality of variable impedance elements; and a programming circuit to apply voltages at a plurality of nodes in the series connection of the plurality of variable impedance elements to program at least one of the plurality of variable impedance elements to one of the plurality of non-volatile impedance states responsive to a digital input signal, the programming circuit to determine the voltages to apply at the nodes according to a mapping of the digital input signal to node voltages.

2. The device of claim 1, wherein the plurality of variable impedance elements comprise correlated electron switch (CES) elements.

3. The device of claim 2, wherein application of voltages at a plurality of nodes initiates a set operation or a reset operation in at least one of the CES elements.

4. The device of claim 1, wherein the nodes are located at terminals of the variable impedance elements.

5. The device of claim 1, wherein one or more of the nodes are located between two variable impedance elements of the plurality of variable impedance elements.

6. The device of claim 1, wherein each of the variable impedance elements comprises a first terminal connected to a first node of the plurality of nodes and a second terminal connected to a second node of the plurality of nodes, and wherein the variable impedance element is configurable to a non-volatile impedance state of the plurality of non-volatile impedance states based, at least in part, on a difference in voltages applied to the first and second nodes.

7. The device of claim 1, wherein the programing circuit is configured to apply the voltages at the nodes such that an impedance state of one variable impedance element of the plurality of variable impedance elements is configured while maintaining an impedance state of at least one other variable impedance element the plurality of variable impedance elements unchanged.

8. The device of claim 1, wherein the at least one programing circuit is configured to apply the voltages at the nodes such that impedance states of two or more variable impedance elements of the plurality of variable impedance elements are configured while maintaining impedance states of remaining variable impedance elements of the plurality of variable impedance elements unchanged.

9. The device of claim 1, wherein the plurality of impedance states comprises at least a high impedance state and a low impedance state.

10. A method comprising:
generating a plurality of voltage signals according to a mapping of a digital input signal to node voltages; and
applying the plurality of voltage signals to nodes of a series connection of a plurality of variable impedance elements of a variable impeder device, each of the variable impedance elements being configurable to a non-volatile impedance state between or among a plurality of non-volatile impedance states responsive at least in part to the applied voltage signals,
wherein the variable impedance device comprises a programmed impedance corresponding to the digital input signal.

11. The method of claim 10, wherein applying the plurality of voltage signals comprises maintaining an impedance state of at least one variable impeder device of the plurality of variable impedance devices unchanged.

12. The method of claim 10, wherein applying the plurality of voltage signals comprises configuring at least one variable impeder device of the plurality of variable impeder devices into one of a plurality of impedance states.

13. The method of claim 12, wherein the plurality of impedances states comprises a high impedance state and a low impedance state.

14. The method of claim 10, wherein the plurality of variable impedance elements comprise correlated electron switch (CES) elements.

15. The method of claim 14, wherein application of the voltage signals at a plurality of nodes initiates a set operation or a reset operation in at least one of the CES elements.

* * * * *